(12) United States Patent
Park

(10) Patent No.: US 11,785,732 B2
(45) Date of Patent: Oct. 10, 2023

(54) MEMORY CARD

(71) Applicant: SAMSUNG ELECTRONICS CO., LTD., Suwon-si (KR)

(72) Inventor: Youngwoo Park, Cheonan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 182 days.

(21) Appl. No.: 17/227,043

(22) Filed: Apr. 9, 2021

(65) Prior Publication Data

US 2022/0053651 A1 Feb. 17, 2022

(30) Foreign Application Priority Data

Aug. 14, 2020 (KR) .................. 10-2020-0102712

(51) Int. Cl.
*H05K 5/02* (2006.01)
*H01L 25/18* (2023.01)
*H05K 1/02* (2006.01)
*H05K 1/18* (2006.01)

(52) U.S. Cl.
CPC ............ *H05K 5/026* (2013.01); *H01L 25/18* (2013.01); *H05K 1/0271* (2013.01); *H05K 1/18* (2013.01); *H05K 2201/09027* (2013.01); *H05K 2201/10159* (2013.01)

(58) Field of Classification Search
CPC ....... H01L 25/18; G06F 13/00; G06F 19/077; G06F 19/07733; G06F 19/07743
USPC ............................ 361/736–752; 257/678–679
See application file for complete search history.

(56) References Cited

U.S. PATENT DOCUMENTS

| | | | |
|---|---|---|---|
| 7,120,029 B2* | 10/2006 | Nishizawa | G06K 19/07743 439/945 |
| D548,740 S | 8/2007 | Takiar et al. | |
| 7,476,105 B2* | 1/2009 | Ni | H05K 1/117 439/66 |
| 7,772,686 B2* | 8/2010 | Ye | H01L 23/5388 257/E23.079 |
| 7,795,714 B2* | 9/2010 | Hiew | H01L 25/50 257/679 |
| 8,022,519 B2* | 9/2011 | Takiar | H01L 25/16 257/679 |
| 8,141,240 B2 | 3/2012 | Hiew et al. | |
| 2005/0007745 A1 | 1/2005 | Gochnour et al. | |
| 2006/0027664 A1 | 2/2006 | Lin | |
| 2006/0084287 A1 | 4/2006 | Miller et al. | |
| 2008/0235939 A1* | 10/2008 | Hiew | H05K 3/284 29/841 |
| 2012/0007226 A1 | 1/2012 | Takiar et al. | |

(Continued)

*Primary Examiner* — Tuan T Dinh
(74) *Attorney, Agent, or Firm* — F. CHAU & ASSOCIATES, LLC

(57) ABSTRACT

A memory card includes a case and an integrated circuit package disposed in the case. The case includes a first case edge, a second case edge connected to the first case edge, a third case edge connected to the second case edge, a fourth case edge connected to the third case edge and the first case edge, and a first recessed groove formed in the second case edge, the first recessed groove being spaced apart from the first case edge and inwardly recessed. The integrated circuit package is disposed in an upper portion of the case between the first case edge and a first horizontal line that extends in a direction from a top end of the first recessed groove in the second case edge to the fourth case edge.

16 Claims, 19 Drawing Sheets

(56) References Cited

U.S. PATENT DOCUMENTS

2014/0168914 A1\* 6/2014 Yokoyama .............. H01L 25/16
  361/749
2014/0226293 A1\* 8/2014 Sato ................. G06K 19/07735
  361/752
2014/0301032 A1 10/2014 Stone et al.

\* cited by examiner

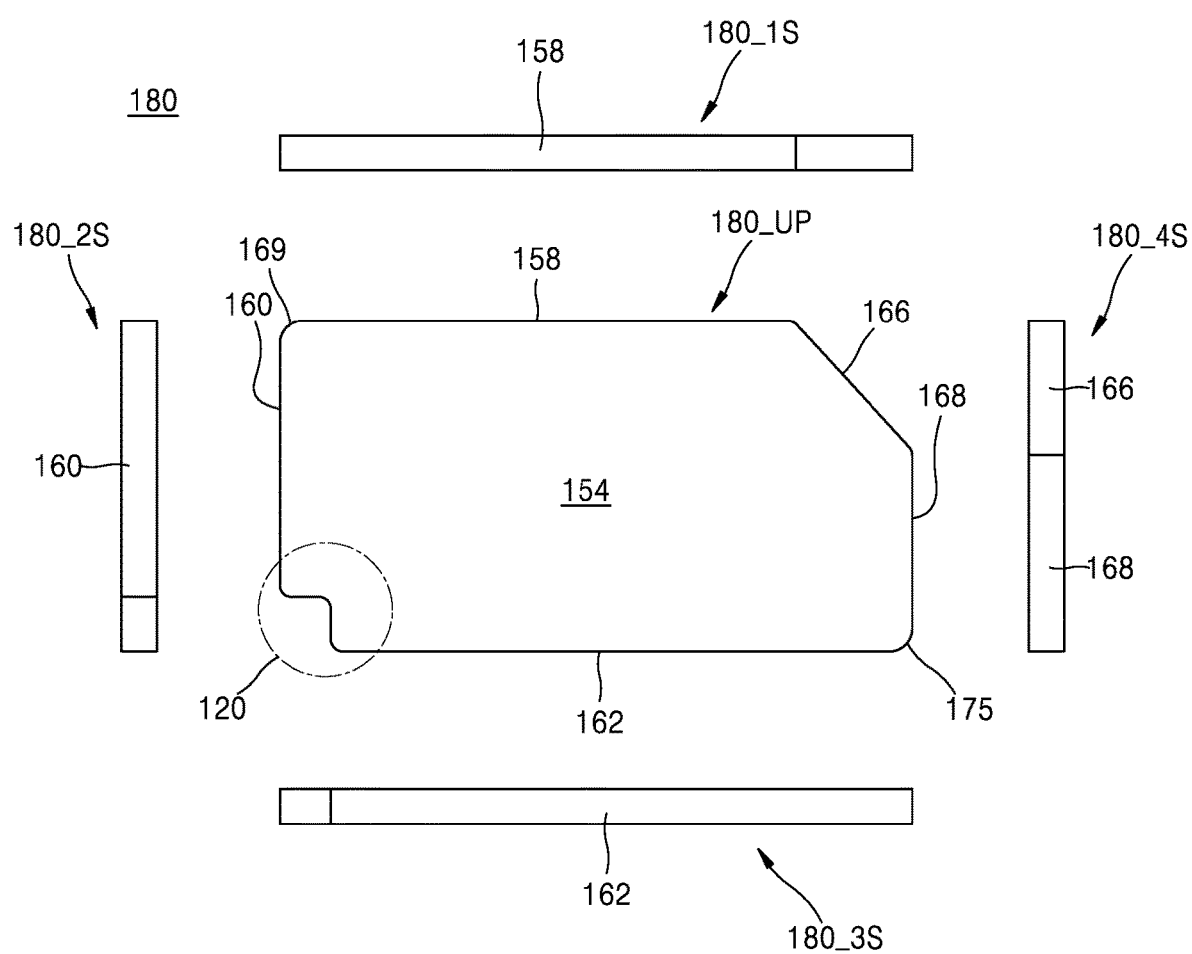

MEMORY CARD

CROSS-REFERENCE TO RELATED APPLICATION

This application claims priority under 35 U.S.C § 119 from Korean Patent Application No. 10-2020-0102712, filed on Aug. 14, 2020 in the Korean Intellectual Property Office, the contents of which are herein incorporated by reference in their entirety.

BACKGROUND

Embodiments of the inventive concept are directed to a memory card, and more particularly, to a memory card that enhances reliability and productivity.

Memory cards are portable and can easily store a large amount of information and are thus widely used in cellular phones, notebook computers, digital cameras, etc. Memory cards that have a large capacity and a high reliability, e.g., small warpage, and that can enhance productivity, are desired.

SUMMARY

Embodiments of the inventive concept provide a memory card that enhances reliability, e.g., reduces warpage, and productivity.

According to an embodiment of the inventive concept, there is provided a memory card that includes a case and an integrated circuit package disposed in the case. The case includes a first case edge, a second case edge connected to the first case edge, a third case edge connected to the second case edge, a fourth case edge connected to the third case edge and the first case edge, and a first recessed groove in the second case edge, the first recessed groove being spaced apart from the first case edge and inwardly recessed toward the fourth edge. The integrated circuit package is disposed in an upper portion of the case between the first case edge and a first horizontal line that extends in a direction from a top end of the first recessed groove in the second case edge to the fourth case edge.

According to another embodiment of the inventive concept, there is provided a memory card that includes an integrated circuit package and a case that envelops the integrated circuit package in correspondence with a shape of the integrated circuit package. The integrated circuit package includes a first edge, a second edge connected to the first edge, a third edge connected to the second edge, and a fourth edge connected to the third edge and a first edge. The case includes a first case edge, a second case edge connected to the first case edge, a third case edge connected to the second case edge, a fourth case edge connected to the third case edge and the first case edge, and a first recessed groove in the second case edge. The first recessed groove starts at a first distance from the first case edge and extends in a direction toward the third case edge.

The third edge of the integrated circuit package spaced apart by a third distance from the first case edge, the third distance being less than the first distance.

According to a further embodiment of the inventive concept, there is provided a memory card that includes an integrated circuit package and a case that envelops the integrated circuit package in correspondence with a shape of the integrated circuit package. The case includes a first case edge; a second case edge connected to the first case edge; a third case edge connected to the second case edge; a fourth case edge connected to the third case edge and the first case edge; an inwardly recessed first recessed groove in the second case edge, and an inwardly recessed second recessed groove in the fourth case edge.

The first recessed groove starts at a first distance from the first case edge and extends in a direction toward the third case edge, and the second recessed groove starts at a second distance from the first case edge and extends in the direction toward the third case edge.

The integrated circuit package includes a first edge that corresponds to the first case edge; a second edge that corresponds to the second case edge; a third edge that corresponds to the third case edge; and a fourth edge that corresponds to the fourth case edge.

The third edge of the integrated circuit package is spaced apart by a third distance from the first case edge and has a fourth distance from the first edge to the third edge, the third distance being less than each of the first distance and the second distance, and the fourth distance being less than each of the first distance and the second distance.

BRIEF DESCRIPTION OF THE DRAWINGS

FIGS. 13A and 13B illustrate an integrated circuit package according to an embodiment.

DETAILED DESCRIPTION

Figure 1:
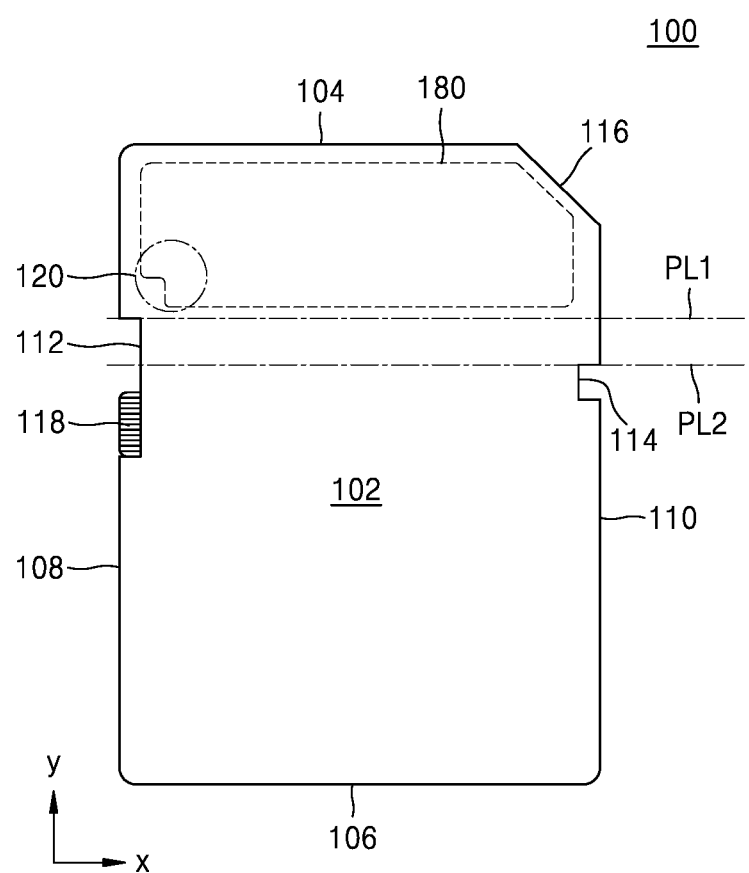
FIGS. 1 and 2 are respectively a top view and a bottom view of a memory card according to embodiments.

Hereinafter, embodiments will be described in detail with reference to the accompanying drawings. Embodiments may be individually implemented, or at least two embodiments may be combined. Therefore, the inventive concept is not limited to an embodiment.

In the drawings, elements may be exaggerated for clarity of the description.

Figure 2:
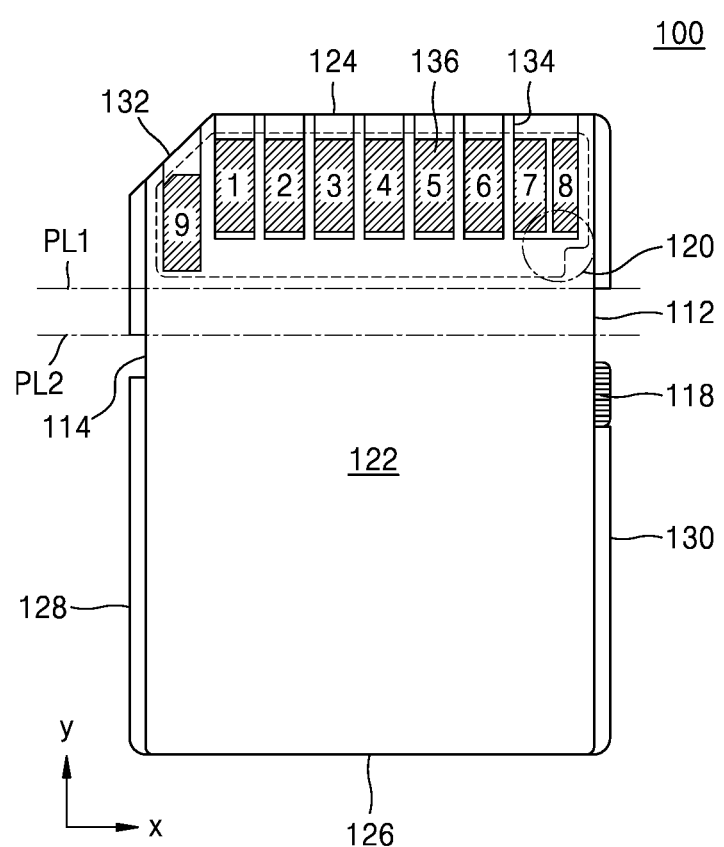

FIGS. 1 and 2 are respectively a top view and a bottom view of a memory card according to embodiments.

In detail, in FIGS. 1 and 2, the X-axis direction is a short-axis direction or a horizontal direction of a memory card 100, and the Y-axis direction is a long-axis direction or a vertical direction of the memory card 100. However, the X-axis direction may be a long-axis direction or a horizontal direction of an integrated circuit package 180, and the Y-axis direction may be a short-axis direction or a vertical direction of the integrated circuit package 180.

In an embodiment, the memory card 100 includes a secure digital (SD) card. The memory card 100 includes a case and the integrated circuit package 180. The integrated circuit package 180 may be referred to as a semiconductor package.

In an embodiment, the case has a shape that corresponds to the integrated circuit package 180 so as to envelop the integrated circuit package 180. The case includes an upper case 102 and a lower case 122 combined with the upper case 102.

The case may be referred to as a housing. The case may be referred to as an outer lid. In an embodiment, when the memory card 100 includes an SD card, the size of the upper and lower cases 102 and 122 can be determined based on standard specifications. Thus, a description with reference to FIGS. 1 and 2 will focus on details of the upper and lower cases 102 and 122.

Referring to FIG. 1, in an embodiment, the upper case 102 includes a first upper case edge 104 and a second upper case edge 108 connected to the first upper case edge 104.

In an embodiment, the upper case 102 includes a third upper case edge 106 connected to the second upper case edge 108 and a fourth upper case edge 110 connected to the third upper case edge 106 and the first upper case edge 104. An upper case chamfer 116 that has a slope is formed in the corner between the first upper case edge 104 and the fourth upper case edge 110. In other words, the upper case chamfer 116, which has a shape resulting from cutting off the corner, is located between the first upper case edge 104 and the fourth upper case edge 110. In an embodiment, the upper case chamfer 116 may be considered as a fifth upper case edge 116 that connects the first upper case edge 104 with the fourth upper case edge 110.

Referring to FIG. 2, the lower case 122 has a first lower case edge 124 and a second lower case edge 130 connected to the first lower case edge 124.

In an embodiment, the lower case 122 includes a third lower case edge 126 connected to the second lower case edge 130 and a fourth lower case edge 128 connected to the third lower case edge 126 and the first lower case edge 124. A lower case chamfer 132 that has a slope is formed in the corner between the first lower case edge 124 and the knoll lower case edge 128. In other words, the lower case chamfer 132, which has a shape resulting from cutting off the corner, is located between the first lower case edge 124 and the fourth lower case edge 128. In an embodiment, the lower case chamfer 132 may be considered as a fifth lower case edge 116 that connects the first lower case edge 124 with the fourth lower case edge 130.

In an embodiment, the lower case 122 includes openings 134 that expose external contact terminals 136 of the integrated circuit package 180. The external contact terminals 136 include first through ninth external contact terminals 1 through 9.

In an embodiment, the external contact terminals 136 include a signal terminal, a ground terminal, and a power terminal. Of the external contact terminals 136, the first through eighth external contact terminals 1 through 8 are arranged in a horizontal direction, such as the X-axis direction, and the ninth external contact terminal 9 is offset in a negative vertical direction, such as a −Y-axis direction, from the first through eighth external contact terminals 1 through 8 due to the upper and lower case chamfers 116 and 132.

In an embodiment, the first upper case edge 104, the second upper case edge 108, the third upper case edge 106, and the fourth upper case edge 110 are respectively aligned with the first lower case edge 124, the second lower case edge 130, the third lower case edge 126, and the forth lower case edge 128. The upper case chamfer 116 is aligned with the lower case chamfer 132.

As a whole, in an embodiment, the case, including the upper case 102 and the lower case 122, includes a first case edge, which includes the first upper case edge 104 and the first lower case edge 124, a second case edge, which includes the second upper case edge 108 and the second lower case edge 130, connected to the first case edge, a third case edge, which includes the third upper case edge 106 and the third lower case edge 126, connected to the second case edge, and a fourth case edge, which includes the fourth upper case edge 110 and the fourth lower case edge 128, connected to the third case edge and the first case edge. A case chamfer, which includes the upper case chamfer 116 and the lower case chamfer 132, has a slope and is located in the corner between the first case edge, which includes the first upper case edge 104 and the first lower case edge 124, and the fourth case edge, which includes the fourth upper case edge 110 and the fourth lower case edge 128. In an embodiment, the case chamfer may be considered as a fifth case edge that connects the first case edge with the fourth case edge.

In an embodiment, the case, including the upper case 102 and the lower case 122, includes a first recessed groove 112 and a second recessed groove 114. The first recessed groove 112 is formed in the second case edge, which includes the second upper case edge 108 and the second lower case edge 130, and is adjacent to the first case edge, which includes the first upper case edge 104 and the first lower case edge 124. The first recessed groove 112 is inwardly recessed toward the fourth case edge, which includes the fourth upper case edge 110 and the fourth lower case edge 128.

In an embodiment, a switch 118 is located in the first recessed groove 112. The switch 118 can move up and down in the Y-axis direction in the first recessed groove 112. The switch 118 controls an on/off of a writing function of the integrated circuit package 180 of the memory card 100.

In an embodiment, the second recessed groove 114 is formed in the fourth case edge, which includes the fourth upper case edge 110 and the fourth lower case edge 130, and is adjacent to the first case edge, which includes the first upper case edge 104 and the first lower case edge 124. The second recessed groove 114 is inwardly recessed toward the second case edge, which includes the second upper case edge 108 and the second lower case edge 130. The second recessed groove 114 is used when the memory card 100 is inserted into an external device.

The integrated circuit package 180 may include a system-in-package or a multi-chip module. In an embodiment, the integrated circuit package 180 includes one or more semiconductor of memory chips, a control chip, and one or more passive elements.

In an embodiment, the semiconductor chips include a stack of a plurality of semiconductor dies on a panel or a panel substrate. The control chip is separated from the stack of semiconductor chips. The integrated circuit package 180 is a single package that includes the semiconductor chips and the control chip.

In an embodiment, the integrated circuit package 180 is located within the case. In some embodiments, the integrated circuit package 180 is located above the first recessed groove 112 and the second recessed groove 114 in a direction, such as the Y-axis direction, toward the first case edge in a plan view.

In some embodiments, the integrated circuit package 180 is located above a first horizontal line PL1 that extends in a direction, such as the X-axis direction, from a top end of the first recessed groove 112 to the fourth upper case edge 110 in the plan view. In other words, the integrated circuit package 180 is disposed between the first horizontal line PL1 and the first case edge. The integrated circuit package 180 is located above a second horizontal line PL2 that extends in a direction, such as the X-axis direction, from a top end of the second recessed groove 114 to the second upper case edge 108 in the plan view. In other words, the integrated circuit package 180 is disposed between the second horizontal line PL2 and the first case edge. The first horizontal line PL1 is closer to the first case edge than the second horizontal line PL2. In some embodiments, the outer shape of the integrated circuit package 180 is aligned with the ninth external contact terminal 136-9 in the plan view.

As described above, in an embodiment, the integrated circuit package 180 is small relative to the size of the memory card 100. The area of the integrated circuit package 180 above the first recessed groove 112 and the second recessed groove 114 is less than or equal to ¼, or 25%, of the area of the case.

In some embodiments, the integrated circuit package 180 has a notch 120 in a corner thereof adjacent to the first recessed groove 112. When the integrated circuit package 180 has the notch 120 in the corner, the possibility of a collision between the integrated circuit package 180 and the switch 118 is reduced and a heat dissipation characteristic may be enhanced, so that reliability may be enhanced due to reduced warpage.

In addition, in an embodiment, because the size of the integrated circuit package 180 within the case of the memory card 100 is relatively small, reliability is enhanced due to reduced warpage. When the size of the integrated circuit package 180 is small, the number of integrated circuit packages 180 that can be produced from a single panel or a panel substrate increases, and accordingly, the productivity of the memory card 100 is enhanced. The size, structure, arrangement, manufacturing processes, etc., of the integrated circuit package 180 are described in detail below.

Figure 3:
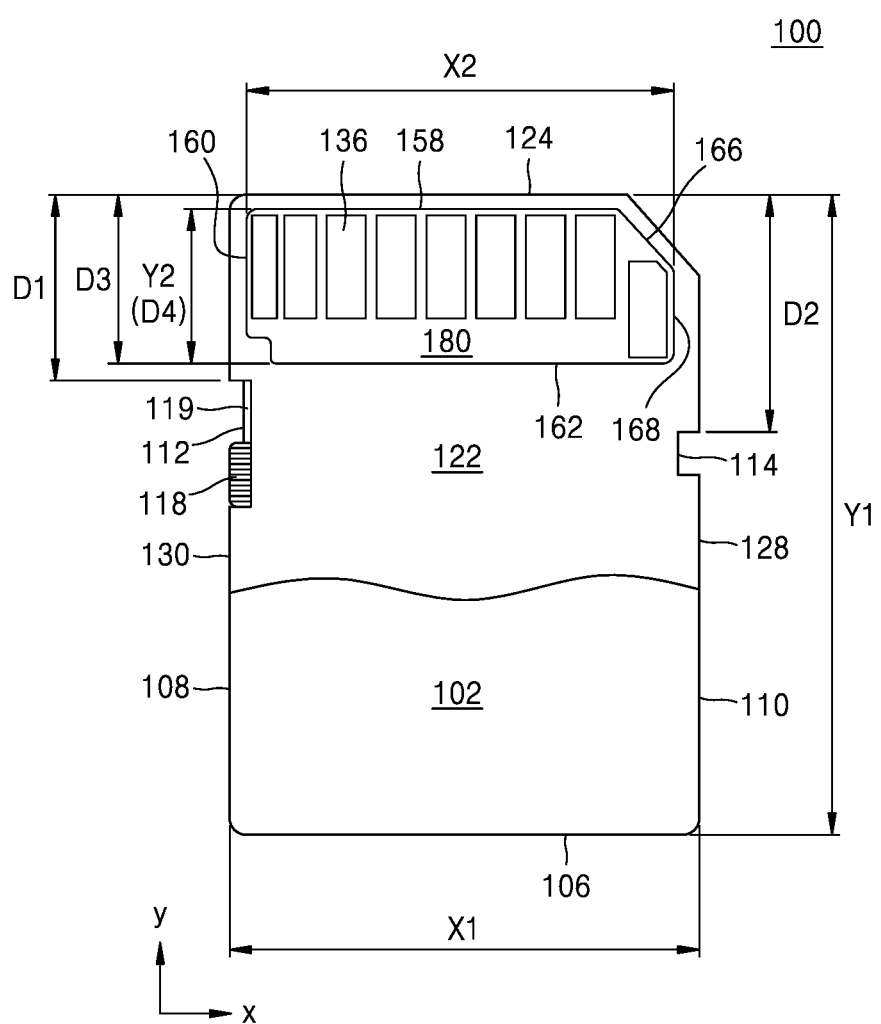
FIGS. 3 through 5 are exploded views of a memory card according to embodiments.
Figure 4:
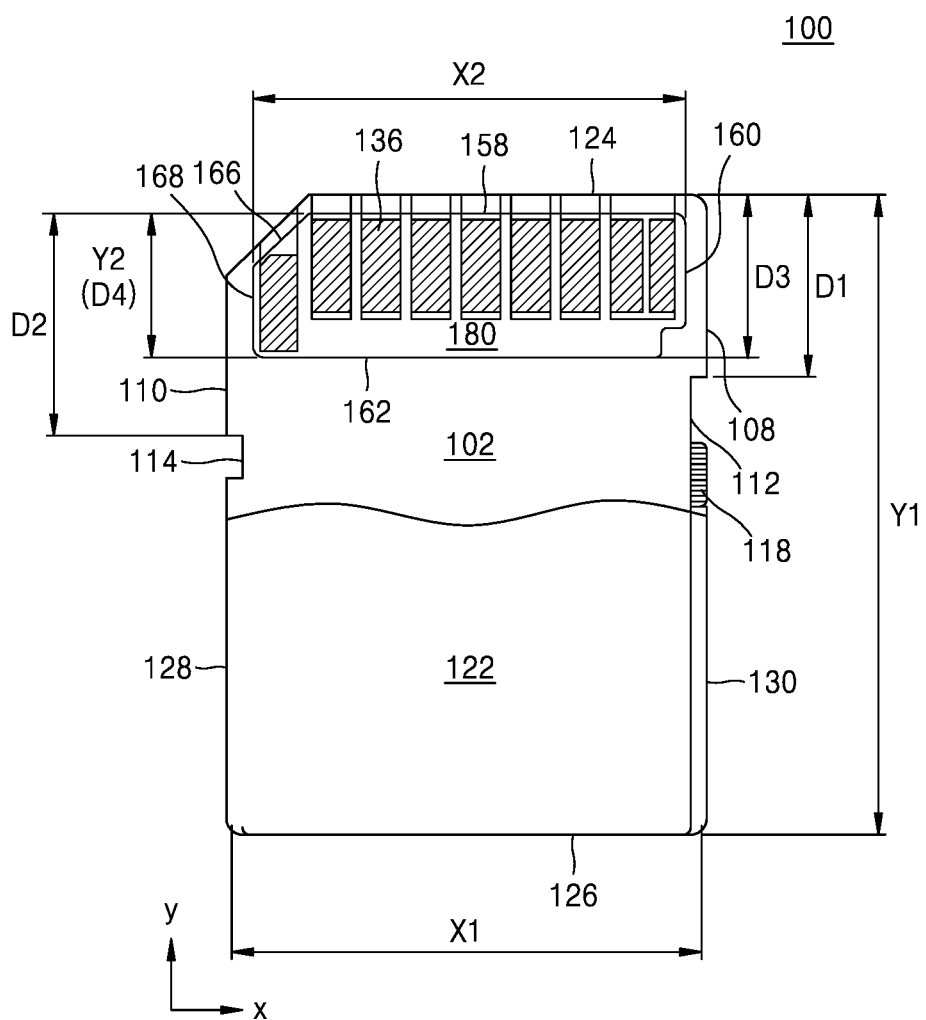
Figure 5:
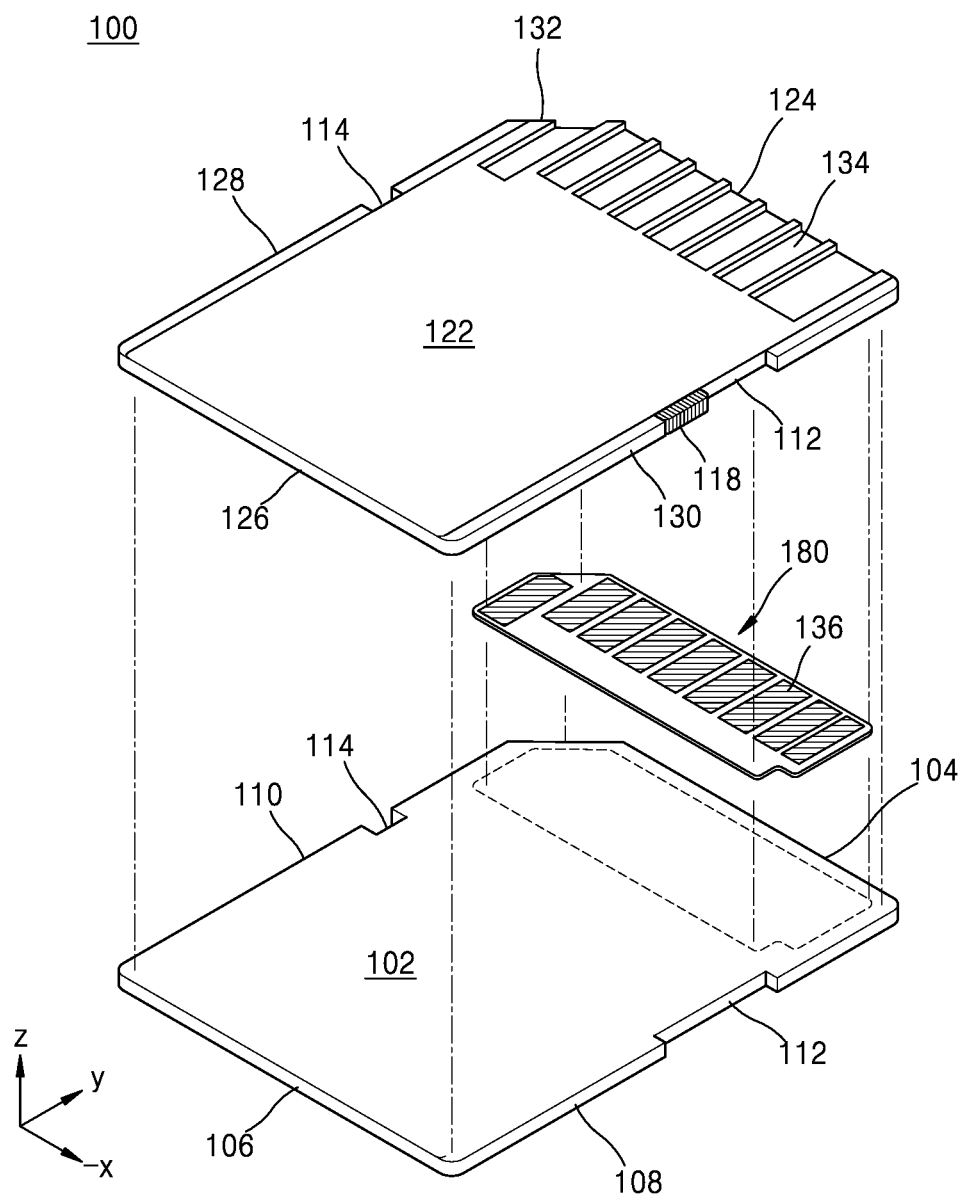

FIGS. 3 through 5 are exploded views of a memory card according to embodiments.

In detail, FIGS. 3 and 4 are respectively a partial exploded top view and a partial exploded bottom view of the memory card 100, and FIG. 5 is an exploded perspective view of the memory card 100. In FIGS. 1 through 5, like numerals denote like elements.

In an embodiment, the memory card 100 includes the integrated circuit package 180 between the upper case 102 and the lower case 122, as shown in FIG. 5. In other words, the integrated circuit package 180 is located within the case, between the upper case 102 and the lower case 122. The openings 134 that expose the external contact terminals 136 of the integrated circuit package 180 are formed in the lower case 122.

In an embodiment, the memory card 100 or case has a length X1 in the X-axis direction and a length Y1 in the Y-axis direction. The length X1 may be 24 mm, and the length Y1 may be 32 mm, however, embodiments are not necessarily limited thereto. The integrated circuit package 180 has a length X2 in the X-axis direction and a length Y2 in the Y-axis direction. The length X2 may range from about 20 mm to about 21 mm, and the length Y2 may range from about 7.0 mm to about 7.5 mm, however, embodiments are not necessarily limited thereto.

In an embodiment, the integrated circuit package 180 is located within the case, between the upper case 102 and the lower case 122. The integrated circuit package 180 includes a first edge 158, a second edge 160 connected to the first edge 158, a third edge 162 connected to the second edge 160, and a fourth edge 168 connected to the third edge 162 and the first edge 158.

In an embodiment, a chamfer 166 is in the corner between the fourth edge 168 and the first edge 158. In other words, the chamfer 166 results from cutting off the corner and is located between the fourth edge 168 and the first edge 158. The chamfer 166 may be considered a fifth edge 166 that connects the fourth edge 168 and the first edge 158.

As described above, in an embodiment, the case, which includes the upper case 102 and the lower case 122, includes the first case edge, which includes the first upper case edge 104 and the first lower case edge 124, the second case edge, which includes the second upper case edge 108 and the second lower case edge 130, the third case edge, which includes the third upper case edge 106 and the third lower case edge 126, and the fourth case edge, which includes the fourth upper case edge 110 and the fourth lower case edge 128. Referring to FIGS. 3 and 4, the first recessed groove 112 is formed in the second case edge starting at a first distance D1 from the first case edge and extending toward the third case edge, i.e., in the −Y-axis direction. The first distance D1 may be about 7.8 mm, however, embodiments are not necessarily limited thereto.

In an embodiment, the switch 118 is located in the first recessed groove 112. The switch 118 can move up and down in the first recessed groove 112 in the Y-axis direction along a guide groove 119 provided in the lower case 122.

In an embodiment, the second recessed groove 114 is formed in the fourth case edge starting at a second distance D2 from the first case edge and extending toward the third case edge, i.e., in the −Y-axis direction. The second distance D2 may be about 10 mm, however, embodiments are not necessarily limited thereto.

In an embodiment, the third edge 162 of the integrated circuit package 180 is located at a third distance D3 from the first case edge, where the third distance D3 is less than each of the first distance D1 and the second distance D2. The integrated circuit package 180 extends a fourth distance D4 from the first edge 158 to the third edge 162, where the fourth distance D4 is less than each of the first distance D1 and the second distance D2. The fourth distance D4 is substantially equal to the length Y2 of the integrated circuit package 180 in the Y-axis direction.

As described above, in an embodiment, the memory card 100 includes the integrated circuit package 180 that is small relative to the case, thereby enhancing reliability by reducing warpage.

Figure 6:
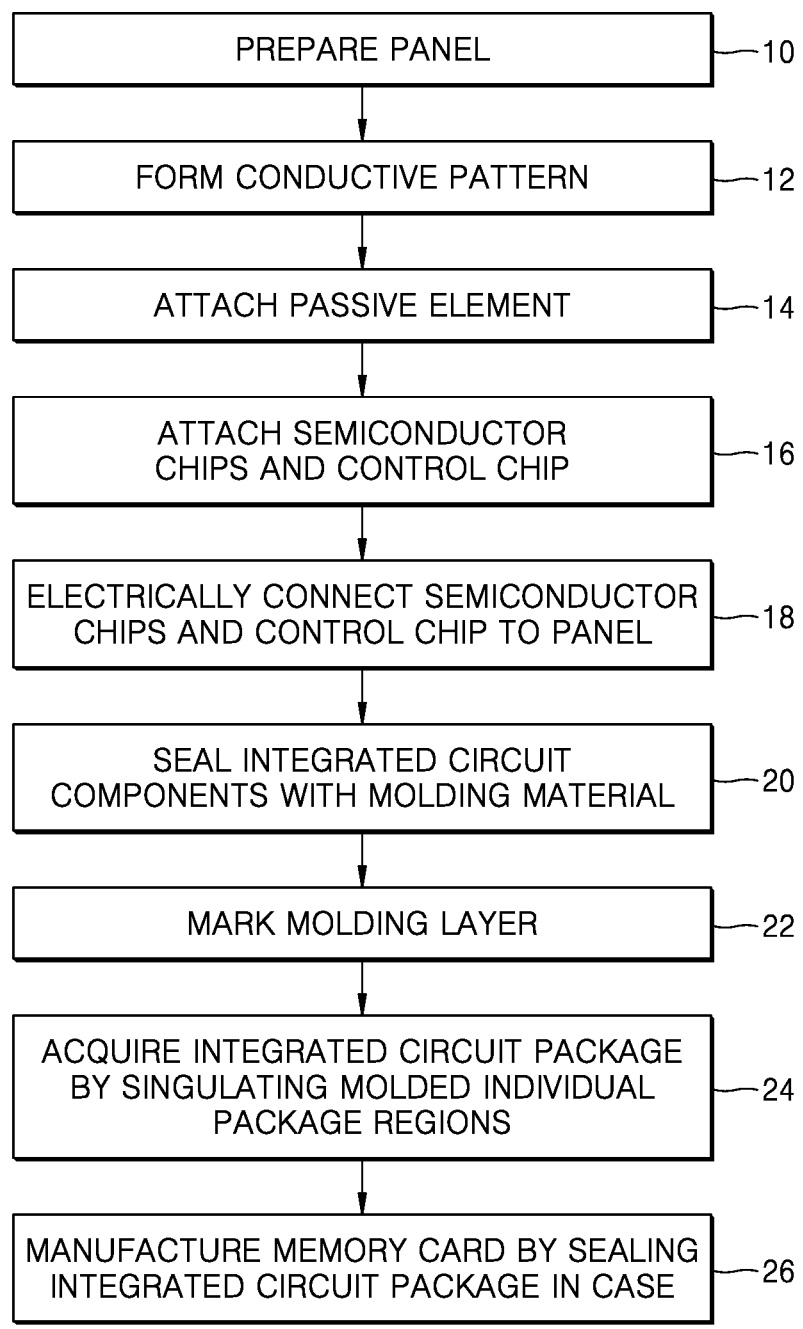
FIG. 6 is a flowchart of a method of manufacturing a memory card, according to an embodiment.

FIG. 6 is a flowchart of a method of manufacturing a memory card according to an embodiment, and FIGS. 7 through 12 are diagrams that illustrate the method of FIG. 6.

In detail, FIGS. 6 through 12 illustrate a method of manufacturing the memory card 100 of FIGS. 1 through 5. In FIGS. 7 through 12, the X-axis direction is the long-axis direction or the horizontal direction of the integrated circuit package 180, as shown in FIGS. 1 through 5, and the Y-axis direction is the short-axis direction or the vertical direction of the integrated circuit package 180.

The Z-axis direction is perpendicular to a surface of a panel 140 in FIGS. 7 through 11 or to a surface of the integrated circuit package 180 in FIGS. 1 through 5. The Z-axis direction is perpendicular to a plane defined by the X-axis direction and the Y-axis direction. In FIGS. 1 through 5 and FIGS. 7 through 12, like numerals denote like elements.

In an embodiment, the panel 140 is prepared or provided in operation 10. The panel 140 may be a printed circuit board (PCB), a lead frame substrate, or a tape substrate. In a present embodiment, the panel 140 is a PCB. The PCB includes a dielectric core layer, and a conductive layer is disposed on a top surface or a bottom surface of the dielectric core layer.

Figure 7:
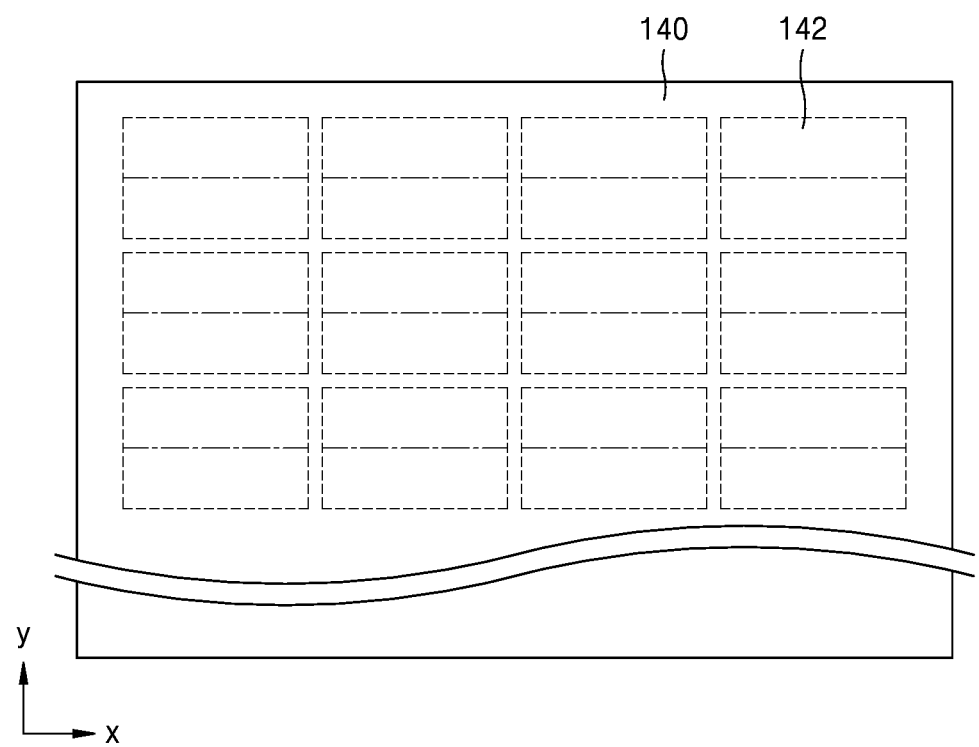
FIGS. 7 through 12 illustrate a method of FIG. 6.

In an embodiment, a conductive pattern is formed on a top surface or a bottom surface of the panel 140 in operation 12. The conductive pattern may include a contact terminal, a contact pad, a lead pattern, or a connector, etc. The conductive pattern electrically connects semiconductor chips or passive elements on the panel 140 to an external electronic device. As shown in FIG. 7, the conductive pattern includes a plurality of individual package regions 142.

Figure 8:
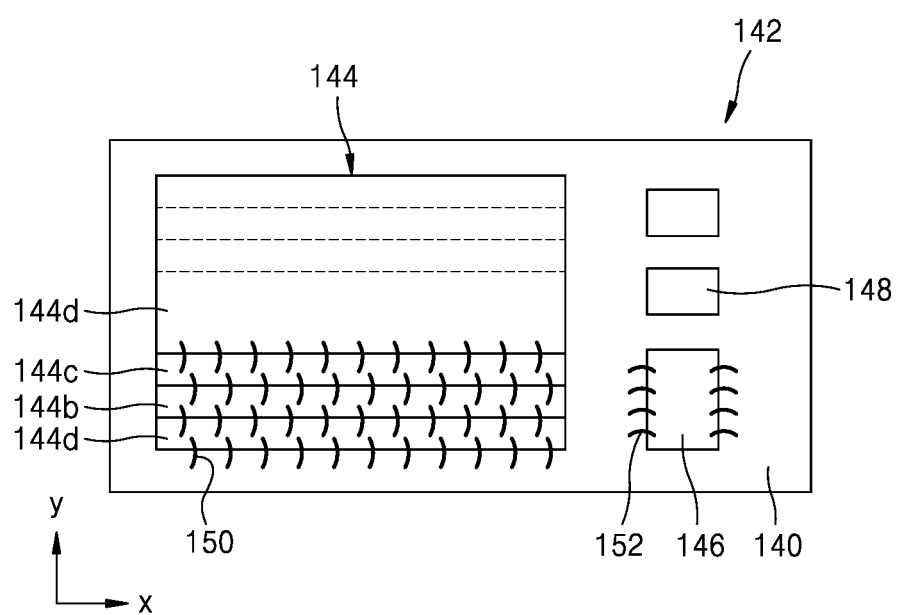
Figure 10:
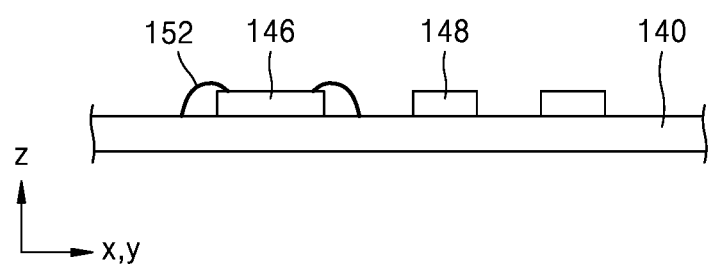

In an embodiment, in operation 14, passive elements 148 are attached to or mounted on each of the individual package regions 142 formed in the panel 140, as shown in FIGS. 8 and 10.

In a present embodiment, each of the passive elements 148 may be a capacitor or a resistor. The integrated circuit package 180 is formed in each of the individual package regions 142 through subsequent processes. The passive elements 148 form integrated circuit components.

In a present embodiment, the integrated circuit package 180 is small, and therefore, a large number of integrated circuit packages 180 can be formed on the panel 140 so that the productivity of the memory card is enhanced.

Figure 9:
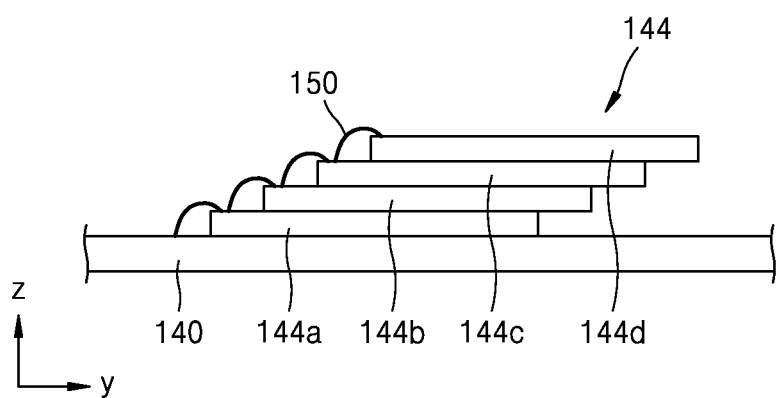

In an embodiment, as shown in FIGS. 8 to 10, semiconductor chips 144 and a control chip 146 are attached to or mounted on each of the individual package regions 142 in the panel 140 in operation 16. The semiconductor chips 144 and the control chip 146 form integrated circuit components. FIG. 8 shows the passive elements 148, the semiconductor chips 144, and the control chip 146, which are attached to a single individual package region 142.

In an embodiment, as shown in FIG. 9, the semiconductor chips 144 include a stack of a plurality of, such as four, semiconductor dies, i.e., first through fourth semiconductor dies 144a through 144d, in a cascade. The semiconductor chips 144 include the second through fourth semiconductor dies 144b through 144d, which are sequentially stacked on the first semiconductor die 144a, with each being offset from the other in the Y-axis direction. FIGS. 8 and 9 illustrate the semiconductor chips 144, i.e., the first through fourth semiconductor dies 144a through 144d, stacked on the panel 140.

In an embodiment, the semiconductor chips 144 include memory semiconductor chips. The semiconductor chips 144 include non-volatile memory chips, e.g., flash memory chips. The semiconductor chips 144 include four semiconductor dies, i.e., the first through fourth semiconductor dies 144a through 144d in a present embodiment, but embodiments are not limited thereto, and may include eight or 16 semiconductor dies in some embodiments.

In an embodiment, the control chip 146 spaced apart from the semiconductor chips 144. In other words, the control chip 146 is arranged at a side of the semiconductor chips 144. In some embodiments, one of the first through fourth semiconductor dies 144a through 144d that form the semiconductor chips 144 may be configured to be a control chip. FIG. 10 illustrates the control chip 146 and the passive elements 148 on the panel 140.

In an embodiment, the semiconductor chips 144 and the control chip 146 are electrically connected to the panel 140 in operation 18. The semiconductor chips 144 and the control chip 146 may be electrically connected to the panel 140 using wire bonding.

As shown in FIGS. 9 and 10, in an embodiment, the semiconductor chips 144 are electrically connected to the panel 140 using a bonding wire 150, which extends in the Y-axis direction of the integrated circuit package 180. The control chip 146 is electrically connected to the panel 140 using a bonding wire 152, which extends in the X-axis direction or the Y-axis direction of the integrated circuit package 180. FIGS. 9 and 10 show that the semiconductor chips 144 and the control chip 146 are connected to the panel 140 by the bonding wire 150 and the bonding wire 152.

Figure 11:
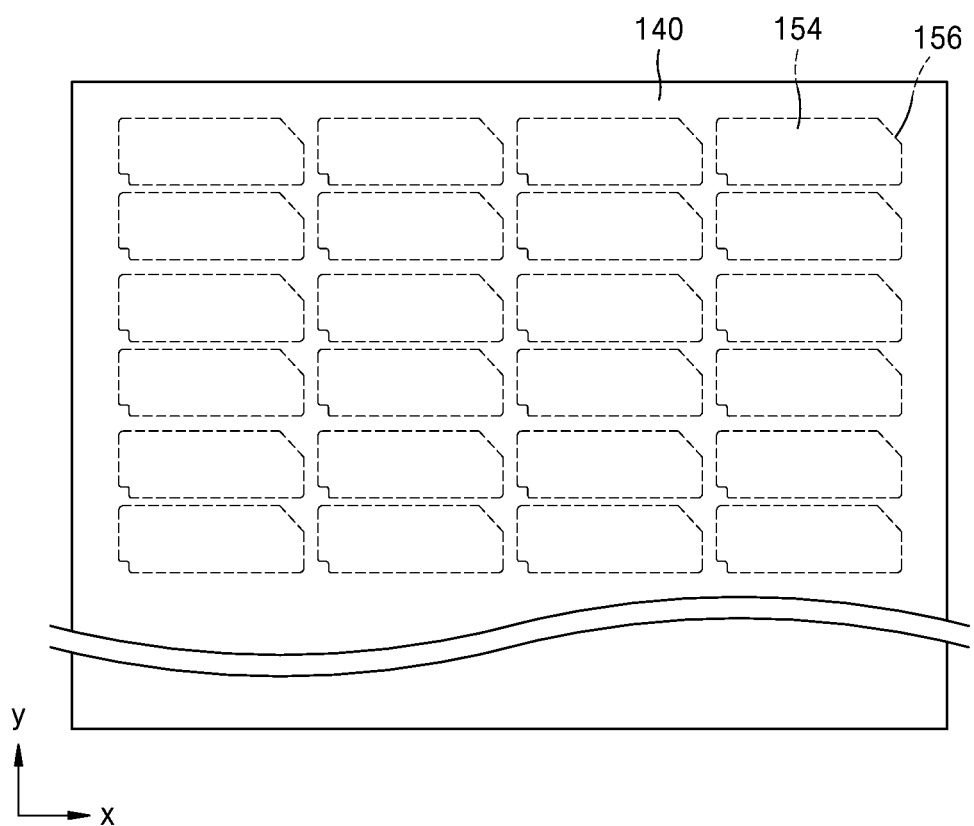

Referring now to FIG. 11, in an embodiment, a molding layer 154 is formed by sealing the integrated circuit components, which include the passive elements 148, the semiconductor chips 144, and the control chip 146, with a molding material in operation 20. The molding material includes an epoxy resin. A molding process includes forming the molding layer 154 by sealing the integrated circuit components, on the panel 140 with a molding material.

Figure 12:
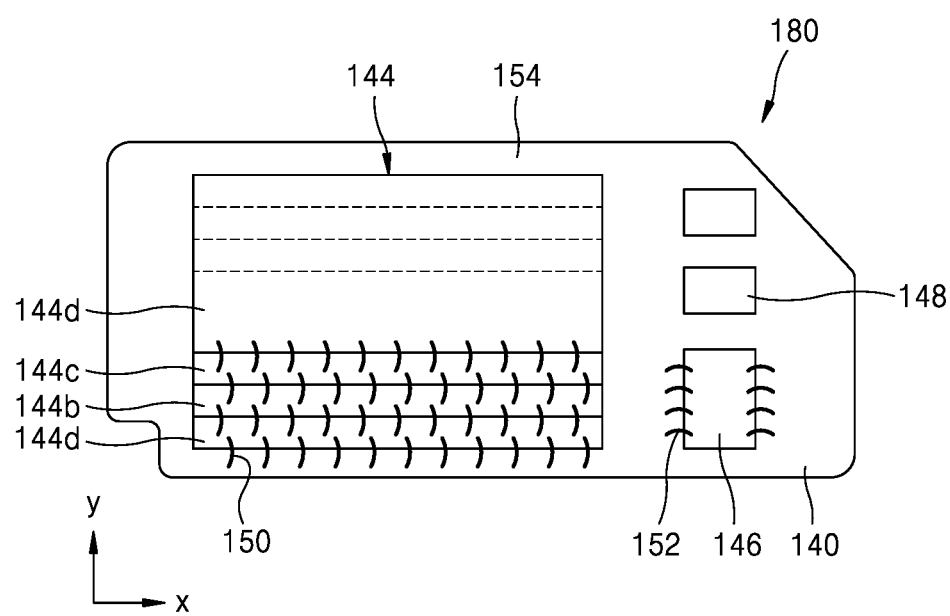

In an embodiment, a marking process is performed on the molding layer 154 in operation 22. A business name or other information can be marked on the molding layer 154 through the marking process. Referring now to FIG. 12, the integrated circuit package 180 is completed in operation 24 by singulating the individual package regions 142 that are molded on the panel 140. FIG. 11 illustrates a cutting line 156 of each of the individual package regions 142 molded on the panel 140.

In some embodiments, singulation includes forming the integrated circuit package 180 by cutting off each of the molded individual package regions 142 along the cutting line 156 using a cutting or punching process. In some embodiments, singulation includes forming the integrated circuit package 180 by cutting off each of the molded individual package regions 142 along the cutting line 156 using a water jet cutting or laser cutting process. FIG. 12 illustrates the integrated circuit package 180 formed by cutting off each of the molded individual package regions 142 along the cutting line 156. The structure of the integrated circuit package 180 will be described in detail below.

Subsequently, in an embodiment, the memory card 100 is manufactured by sealing the integrated circuit package 180 in the case, which includes the upper case 102 and the lower case 122, in operation 26. In other words, the memory card 100 is completely formed by placing the integrated circuit package 180 between the upper case 102 and the lower case 122 and joining the upper case 102 to the lower case 122.

Figure 13B:
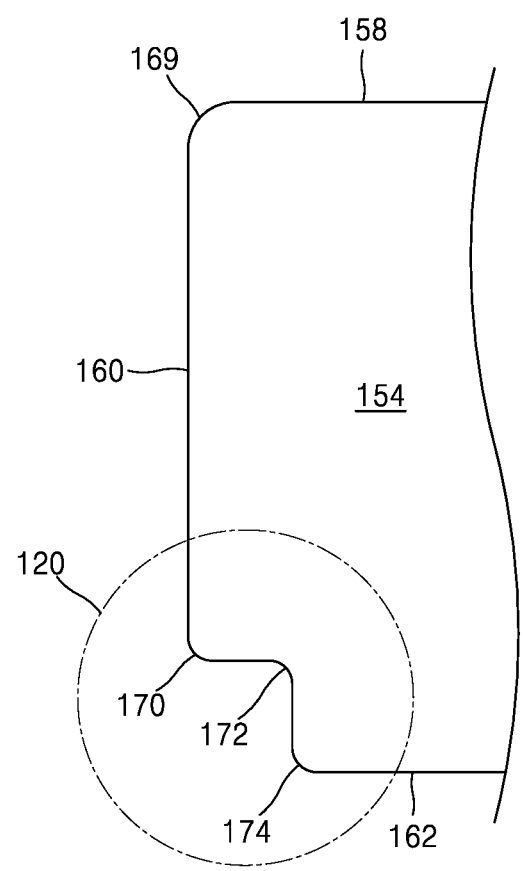

FIGS. 13A and 13B illustrate an integrated circuit package according to an embodiment.

In detail, in an embodiment, FIGS. 13A and 13B illustrate the integrated circuit package 180 included in the memory card 100 of FIGS. 1 through 5. The central portion of FIG. 13A is a top view 180_UP of the integrated circuit package 180. In FIGS. 13A and 13B, the integrated circuit package 180 has been sealed by the molding layer 154.

In an embodiment, the top, left, bottom, and right portions of FIG. 13A are respectively a first edge plan view 180_1S, a second edge plan view 180_2S, a third edge plan view 180_3S, and a fourth edge plan view 180_4S of the integrated circuit package 180. FIG. 13B is a partially enlarged view of the left side of the top view 180_UP in FIG. 13A.

As described above, in an embodiment, the integrated circuit package 180 includes the first edge 158, the second edge 160 connected to the first edge 158, the third edge 162 connected to the second edge 160, and the fourth edge 168 connected to the third edge 162 and the first edge 158.

As shown in FIGS. 13A and 13B, in an embodiment, a first curved connecting portion 169 is located in the corner between the first edge 158 and the second edge 160. As shown in FIG. 13B, the inwardly recessed notch 120 is located at the corner between the second edge 160 and the third edge 162.

In an embodiment, the notch 120 includes a plurality of curved connecting portions, e.g., second through fourth curved connecting portions 170, 172, and 174. The notch 120 includes the second curved connecting portion 170 at an end portion of the second edge 160, the third curved connecting portion 172 at the inner corner thereof, and the fourth curved connecting portion 174 at an end portion of the third edge 162. As shown in FIG. 13A, in a present embodiment, the second curved connecting portion 170 and the third curved connecting portion 172 may be connected by a substantially straight edge that extends in the X-axis direction, and the third curved connecting portion 172 and the fourth curved connecting portion 174 may be connected by a substantially straight edge that extends in the Y-axis direction. As shown in FIG. 13A, a fifth curved connecting portion 175 is located at the corner between the third edge 162 and the fourth edge 168. The chamfer 166 that results from cutting off the corner is located between the fourth edge 168 and the first edge 158.

The first and fifth curved connecting portions 169 and 175 are both provided in a present embodiment, but in other embodiments, only one of the first and fifth curved connecting portions 169 and 175 may be provided. The second through fourth curved connecting portions 170, 172, and 174 are provided in a present embodiment, but in other embodiments, only one of the second through fourth curved connecting portions 170, 172, and 174 may be provided.

In an embodiment, the integrated circuit package 180 configured as described above includes curved connecting portions and a round notch and thus efficiently dissipates heat generated in semiconductor chips and passive elements, thereby enhancing package reliability, by reducing warpage. When the reliability of the integrated circuit package 180 is enhanced, the reliability of a memory card is also enhanced.

Figure 14A:
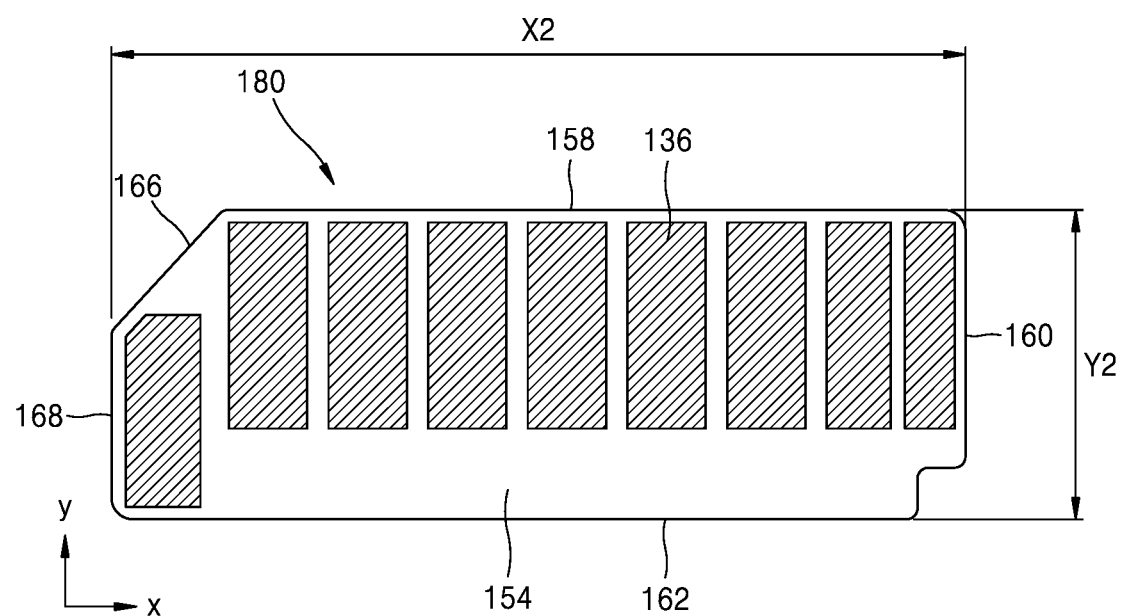
FIGS. 14A and 14B are bottom views of integrated circuit packages according to embodiments.
Figure 14B:
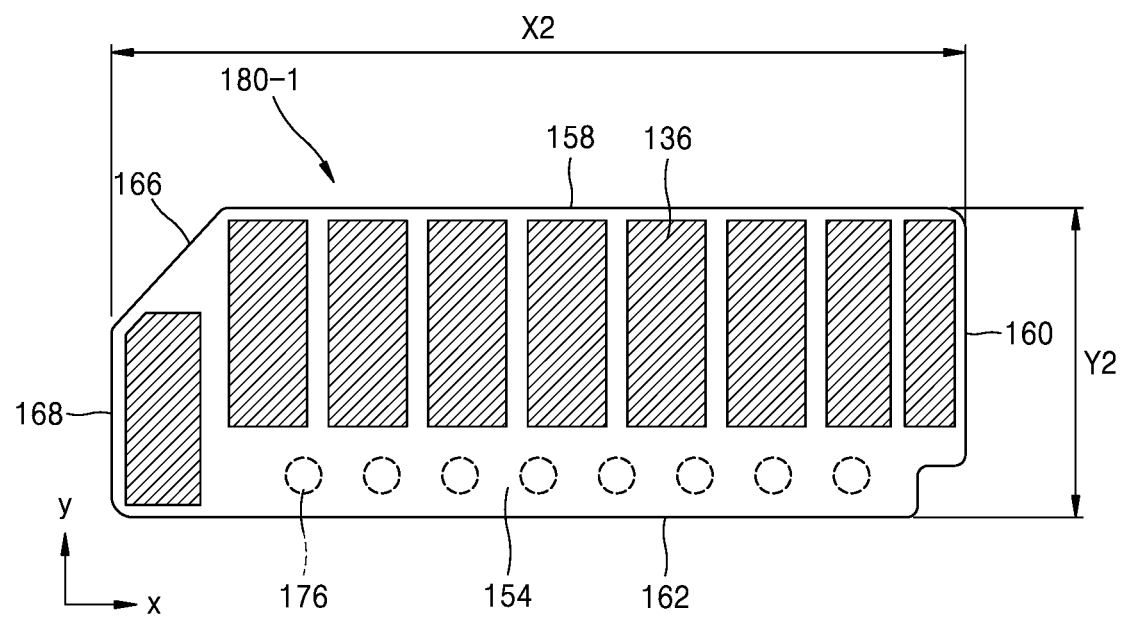

FIGS. 14A and 14B are bottom views of integrated circuit packages according to embodiments.

In detail, in an embodiment, the integrated circuit package 180 of FIG. 14A or an integrated circuit package 180-1 of FIG. 14B may be included in the memory card 100 of FIGS. 1 through 5. Each of the integrated circuit packages 180 and 180-1, except for the external contact terminals 136, is covered with the molding layer 154.

In an embodiment, the integrated circuit package 180-1 of FIG. 14B is the same as the integrated circuit package 180 of FIG. 14A, except for test terminals 176 formed inside the molding layer 154. The test terminals 176 are covered with the molding layer 154 so as not to be externally exposed. In other words, the test terminals 176 are buried by the molding layer 154. The test terminals 176 are used to test operating states of semiconductor chips, a control chip, or passive elements, where the semiconductor chips, the control chip, and the passive elements are included in the integrated circuit package 180-1.

As described above, in an embodiment, each of the integrated circuit packages 180 and 180-1 includes the first edge 158, the second edge 160 connected to the first edge 158, the third edge 162 connected to the second edge 160, and the fourth edge 168 connected to the third edge 162 and the first edge 158. The chamfer 166 that results from cutting off the corner is located between the fourth edge 168 and the first edge 158.

In an embodiment, each of the integrated circuit packages 180 and 180-1 has the length X2 in the X-axis direction and the length Y2 in the Y-axis direction. The length X2 may range from about 20 mm to about 21 mm, and the length Y2 may range from about 7.0 mm to about 7.5 mm, but embodiments are not necessarily limited thereto. The integrated circuit packages 180 and 180-1 described above are short in the Y-axis direction, i.e., the short-axis direction. Accordingly, the integrated circuit packages 180 and 180-1 reduce warpage, thereby increasing package reliability.

Figure 15:
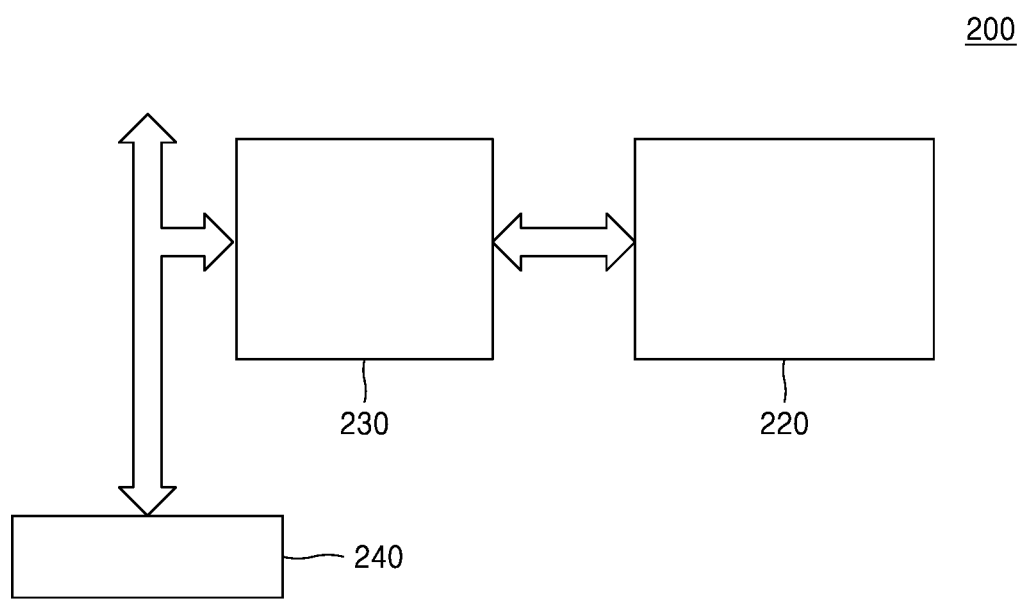
FIG. 15 is a schematic diagram of a system that uses a memory card, according to an embodiment.

FIG. 15 is a schematic diagram of a system that uses a memory card, according to an embodiment.

In an embodiment, a system 200 includes a memory card 220, a card interface controller 230, and a host or an external device 240. The memory card 220 corresponds to the memory card 100 described above with reference to FIGS. 1 through 5.

In an embodiment, the card interface controller 230 controls data exchange with the memory card 220. The card interface controller 230 can be used to store data in the memory card 220. The host 240 controls the card interface controller 230. The host 240 controls the memory card 220 through the card interface controller 230.

Figure 16:
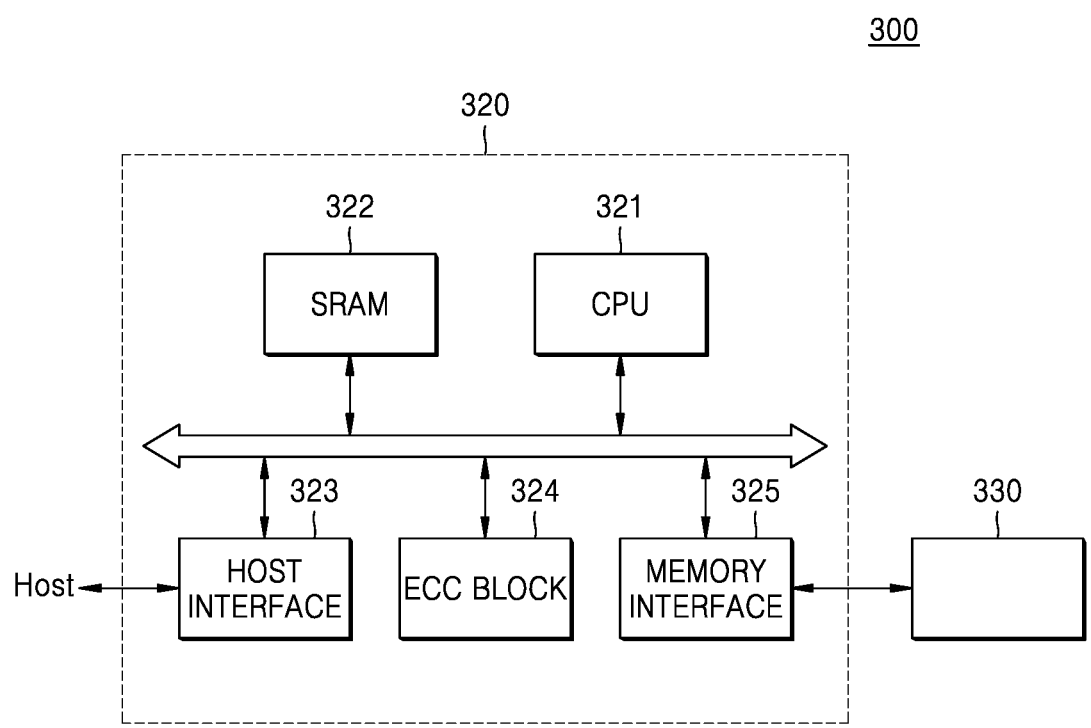
FIG. 16 is a block diagram of a memory device that includes a memory card, according to an embodiment.

FIG. 16 is a block diagram of a memory device that includes a memory card, according to an embodiment.

In an embodiment, a memory device 300 includes a memory card 330. The memory card 330 corresponds to the memory card 100 described above with reference to FIGS. 1 through 5. The memory device 300 includes a memory controller 320 that controls data exchange between a host and the memory card 330.

In an embodiment, the memory controller 320 includes a control processing unit (CPU) 321 that generally controls operations of the memory device 300. The memory controller 320 also includes a static random access memory (SRAM) 322 that is used as a working memory of the CPU 321.

In an embodiment, the memory controller 320 further includes a host interface 323 and a memory interface 325. The host interface 323 includes a protocol for data exchange between the memory device 300 and the host. The memory interface 325 provides an interface between the memory controller 320 and the memory card 330.

In an embodiment, the memory controller 320 furthers include an error correction code (ECC) block 324. The ECC block 324 detects and corrects errors in data read from the memory card 330.

In an embodiment, the memory device 300 may further include a read-only memory (ROM) device that stores code data for interfacing with the host. The memory device 300 can be implemented as a solid state drive (SSD) that replaces a hard disk of a computer system.

Figure 17:
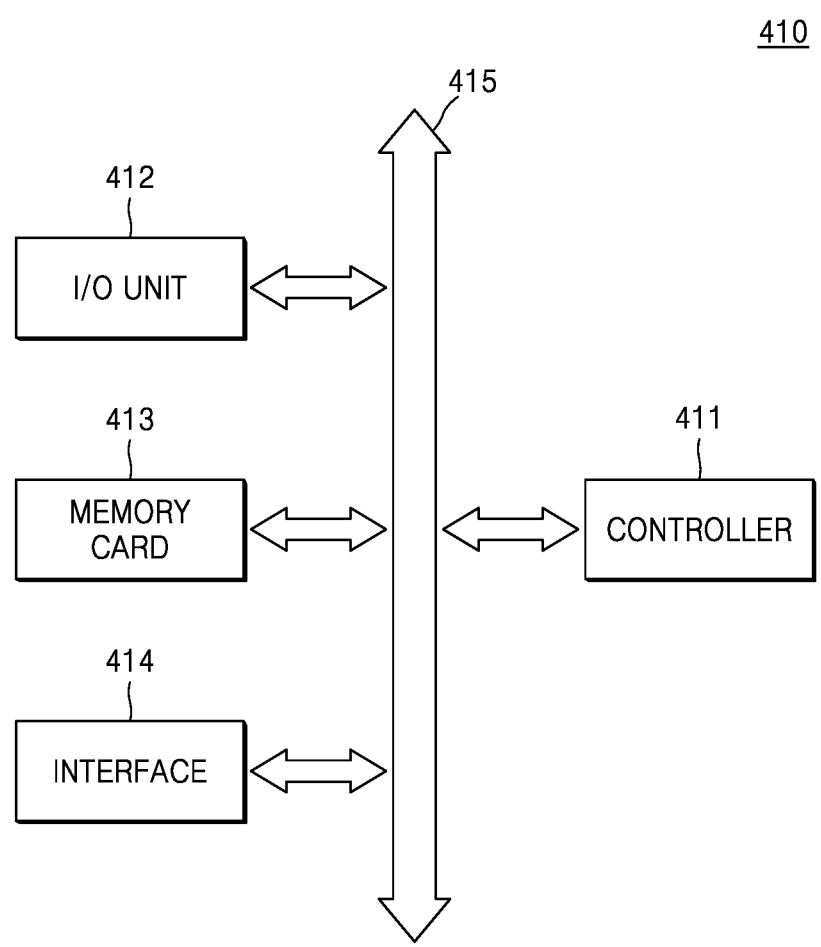
FIG. 17 is a block diagram of an electronic system that includes a memory card, according to an embodiment.

FIG. 17 is a block diagram of an electronic system that includes a memory card, according to an embodiment.

In an embodiment, an electronic system 410 includes a controller 411, an input/output (I/O) unit 412, a memory card 413, an interface 414, and a bus 415. The controller 411, the I/O unit 412, the memory card 413, and the interface 414 are connected with each other through the bus 415. The bus 415 is a path for data flow.

In an embodiment, the controller 411 is at least one of a microprocessor, a digital signal processor, a micro controller, or logic elements that perform similar functions. The I/O unit 412 may include a keypad, a keyboard, or a display.

In an embodiment, the memory card 413 stores data or commands. The memory card 413 corresponds to the memory card 100 described above with reference to FIGS. 1 through 5. The interface 414 transmits data to or receives data from a communication network.

The interface 414 may be wired or wireless. In an embodiment, the interface 414 may include an antenna or a wired/wireless transceiver. In addition, the electronic system 410 further includes a high-speed DRAM device or a SRAM device as a working memory device that enhances operations of the controller 411.

In an embodiment, the electronic system 410 can be incorporated into a personal digital assistant (PDA), a portable computer, a web tablet, a wireless phone, a mobile phone, a digital music player, or any electronic product capable of transmitting or receiving information in a wireless environment.

While the inventive concept has been particularly shown and described with reference to embodiments thereof, it will be understood that various changes in form and details may be made therein without departing from the spirit and scope of the following claims.

What is claimed is:

1. A memory card, comprising:
a case; and
an integrated circuit package disposed in the case,
wherein the case includes a first case edge, a second case edge connected to the first case edge, a third case edge connected to the second case edge, a fourth case edge connected to the third case edge and the first case edge, and a first recessed groove in the second case edge, the first recessed groove being spaced apart from the first case edge and inwardly recessed toward the fourth edge,
the integrated circuit package is disposed in an upper portion of the case between the first ease edge and a first horizontal lime that extends in a direction from a top end of the first recessed groove in the second case edge to the fourth case edge, wherein the integrated circuit package does not overlap with the first recessed groove;
the memory card further comprising a switch located in the first recessed groove, and the integrated circuit package occupies at most 1/4 of an area of the case, and
wherein the case further includes a second recessed groove in the fourth case edge, the second recessed groove being spaced apart from the first case edge and inwardly recessed toward the second edge, and
the integrated circuit package is disposed in the upper portion of the case between the first case edge and a second horizontal line that extends in a direction from a top end of the second recessed groove in the fourth case edge to the second case edge, wherein the integrated circuit package does not overlap with the second recessed groove.

2. The memory card of claim 1, wherein the first horizontal line is closer to the first case edge than the second horizontal line.

3. The memory card of claim 1, wherein the memory card includes a secure digital (SD) card.

4. The memory card of claim 1, wherein a length of each of the first case edge and the third case edge is less than a length of each of the second case edge and the fourth case edge.

5. The memory card of claim 1, wherein the integrated circuit package includes a single package that includes a plurality of semiconductor chips and a control chip that is spaced apart from the plurality of semiconductor chips.

6. The memory card of claim 1, wherein the integrated circuit package includes a first edge, a second edge, a third edge, a fourth edge, and a notch in a corner between the second edge and the third edge, the notch being adjacent to the first recessed groove.

7. The memory card of claim 6, wherein the integrated circuit package further includes a curved connecting portion in at least one of a corner between the first edge and the second edge or a corner between the third edge and the fourth edge.

8. The memory card of claim 6, wherein
the case further includes a case chamfer in a corner between the fourth case edge and the first case edge, and
the integrated circuit package further includes a chamfer in a corner between the fourth edge and the first edge that corresponds to the case chamfer.

9. A memory card, comprising:
an integrated circuit package: and
a case that envelops the integrated circuit package in correspondence with a shape of the integrated circuit package,
wherein the integrated circuit package includes a first edge, a second edge connected to the first edge, a third edge connected to the second edge, and a fourth edge connected to the third edge and the first edge:
the case includes a first case edge, a second case edge connected to the first case edge, a third case edge connected to the second case edge, a fourth case edge connected to the third case edge and the first case edge, and a first recessed groove in the second case edge,
wherein the integrated circuit package does not overlap with the first recessed groove;
the memory card further comprising a switch located in the first recessed groove, and the integrated circuit package occupies at most 1/4 of an area of the case, and
wherein the case further includes a second recessed groove in the fourth case edge, wherein the integrated circuit package does not overlap with the second recessed groove.

10. The memory card of claim 9, wherein the integrated circuit package further includes a notch in a corner between the second edge and the third edge, the notch being adjacent to the first recessed groove.

11. The memory card of claim 9, wherein the integrated circuit package further includes a curved connecting portion in at least one of a corner between the first edge and the second edge or corner between the third edge and the fourth edge.

12. The memory card of claim 9, wherein the integrated circuit package further includes a molding layer and test terminals buried in the molding layer and covered by the molding laver.

13. A memory card, comprising:
an integrated circuit package: and
a case that envelops the integrated circuit package in correspondence with a shape of the integrated circuit package,
wherein the case includes a first case edge, a second case edge connected to the first case edge, a third case edge connected to the second case edge, a fourth case edge connected to the third case edge and the first case edge, an inwardly recessed first recessed groove formed in the second case edge, and an inwardly recessed second recessed groove formed in the fourth case edge,
the integrated circuit package includes a first edge that corresponds to the first case edge, a second edge that corresponds to the second case edge, a third edge that corresponds to the third case edge, and a fourth edge that corresponds to the fourth case edge,
the memory card further comprising a switch located in the first recessed groove, and the integrated circuit package occupies at most 1/4 of an area of the case, and
wherein the integrated circuit package does not overlap with the first recessed groove and the second recessed groove.

14. The memory card of claim 13, wherein the integrated circuit package further includes a curved connecting portion in at least one of a corner between the first edge and the second edge or a corner between the third edge and the fourth edge.

15. The memory card of claim 13, wherein the integrated circuit package includes a round notch between the second edge and the third edge, the round notch being adjacent to the first recessed groove, wherein the round notch of the integrated circuit package includes a plurality of curved connecting portions.

16. The memory card of claim 13, wherein
a length of each of the first case edge and the third case edge is less than a length of each of the second case edge and the fourth case edge, and
a length of each of the first edge and the third edge is greater than a length of each of the second edge and the fourth edge.

* * * * *